(12) United States Patent
Betrabet et al.

(10) Patent No.: US 7,923,837 B2
(45) Date of Patent: Apr. 12, 2011

(54) MICROELECTRONIC DEVICE PATTERNED BY ABLATING AND SUBSEQUENTLY SINTERING SAID MICROELECTRONIC DEVICE

(75) Inventors: Chinmay Betrabet, Corvallis, OR (US); Curt Lee Nelson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 683 days.

(21) Appl. No.: 11/981,011

(22) Filed: Oct. 31, 2007

(65) Prior Publication Data

US 2009/0108449 A1    Apr. 30, 2009

(51) Int. Cl.
*H01L 29/40* (2006.01)
(52) U.S. Cl. .............. 257/743; 257/E33.037; 438/608
(58) Field of Classification Search .............. 438/608; 257/743, E33.037
See application file for complete search history.

(56) References Cited

U.S. PATENT DOCUMENTS

| | | | |
|---|---|---|---|
| 6,261,856 B1 * | 7/2001 | Shinohara et al. | 438/30 |
| 6,838,038 B2 | 1/2005 | Lovell | |
| 7,002,292 B2 | 2/2006 | Prakash | |
| 7,134,582 B2 | 11/2006 | Bouten | |
| 2005/0057136 A1 | 3/2005 | Moriya | |
| 2006/0166537 A1 * | 7/2006 | Thompson et al. | 439/189 |
| 2006/0186792 A1 | 8/2006 | Lee | |
| 2009/0212292 A1 * | 8/2009 | Hayton et al. | 257/66 |

FOREIGN PATENT DOCUMENTS

JP    2006-114428    * 4/2006
WO    WO 2006/129126    * 12/2006

* cited by examiner

*Primary Examiner* — Savitri Mulpuri
*Assistant Examiner* — Yasser A Abdelaziez

(57) ABSTRACT

A microelectronic device includes a non-polymeric substrate, an organic interlayer, and a indium tin oxide layer formed on the organic interlayer; the indium tin oxide layer including an ablated feature within said indium tin oxide layer, wherein said indium tin oxide layer is formed by an indium tin oxide solution that is laser ablated prior to sintering.

Applicant respectfully submits that the above amendments bring the Abstract into compliance with MPEP §608.01 (b). Accordingly, Applicant respectfully requests reconsideration and withdrawal of the objection to the abstract.

12 Claims, 2 Drawing Sheets

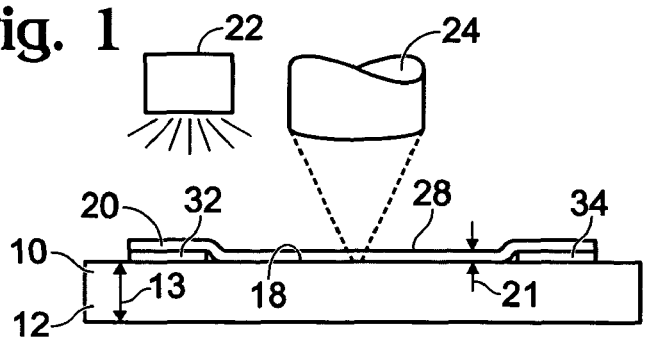
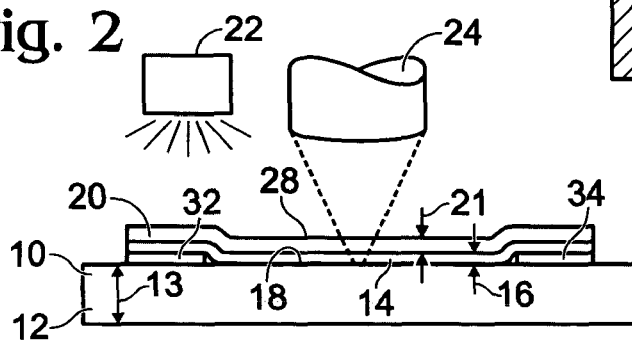
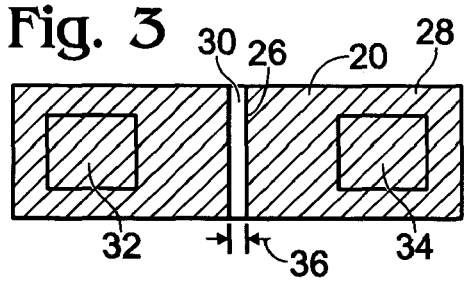
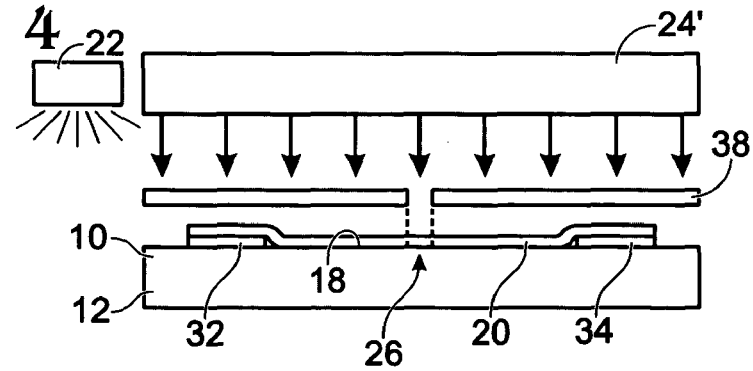
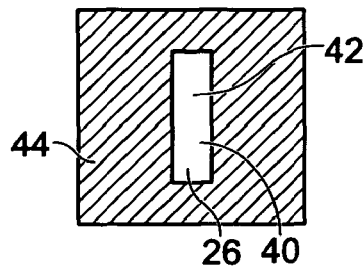
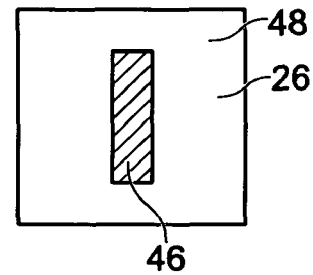

MICROELECTRONIC DEVICE PATTERNED BY ABLATING AND SUBSEQUENTLY SINTERING SAID MICROELECTRONIC DEVICE

BACKGROUND

Microelectronic devices, such as displays, may include surface features such as conductive channels or pads which function as transparent conductors for forming gate electrodes in field effect transistors. A method of forming the channels in printed displays is to coat the surface of a substrate with a solution of an Indium Tin Oxide (ITO) precursor. The ITO layer is sintered and then patterned by ablating. It may be desirable to increase the efficiency of the ablation process.

BRIEF DESCRIPTION OF THE DRAWINGS

FIG. 1 is a schematic side cross-sectional view of one example embodiment of a microelectronic device manufactured in accordance with one example embodiment of a method of manufacturing a microelectronic device.

FIG. 2 is a schematic side cross-sectional view of one example embodiment of a microelectronic device manufactured in accordance with one example embodiment of a method of manufacturing a microelectronic device.

FIG. 3 is a schematic top view of one example embodiment of a microelectronic device.

FIG. 4 is a schematic side cross-sectional view of one example embodiment of a microelectronic device.

FIGS. 5A and 5B are schematic top views of one embodiment of a non-conductive region and one embodiment of a conductive region, respectively.

DETAILED DESCRIPTION OF THE DRAWINGS

Figure 8A:
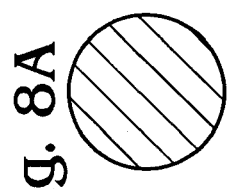
FIG. 8A-8E are schematic top view of several example embodiments of indium tin oxide patterns that may be formed on a microelectronic device manufactured in accordance with several example embodiment of a method of manufacturing a microelectronic device.
Figure 8B:
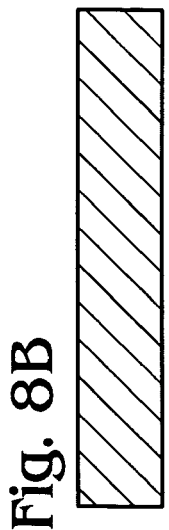
Figure 8D:
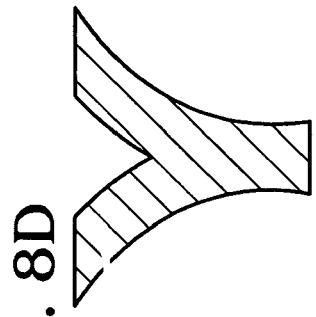
Figure 8C:
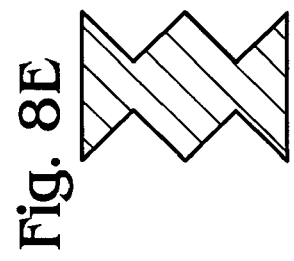
Figure 8E:
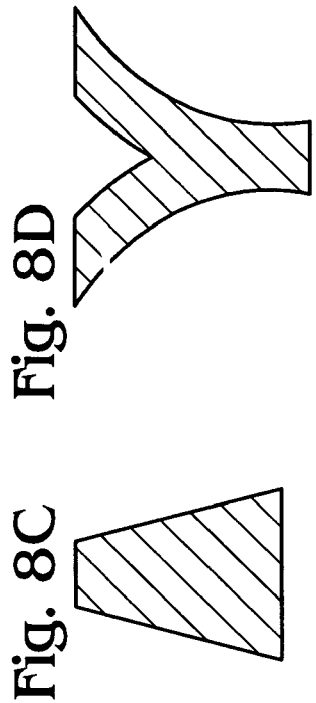

FIGS. 1 and 2 show two example embodiments of a microelectronic device 10, such as a transparent printed display device, a printed circuit, or a radio frequency identification (RFID) tag, for example. FIG. 1 shows device 10 without an interlayer (as will be described below) and FIG. 2 shows device 10 having an interlayer 14. Device 10 may be formed by the following process steps as described below.

A substrate 12 may be provided. Substrate 12 may be a non-polymeric substrate such as a semiconductor, namely, a silicon wafer, a dielectric such as glass, SiC or a non-conducting ceramic. Substrate 12 may have any dimensions or properties as desired for a particular application. In one example embodiment substrate 12 may have the following properties: a thickness 13 of between 30 to 1100 microns, a resistivity of greater than $1 \times 10^8$ ohm, and transmissivity of greater than 90%.

An interlayer 14 (FIG. 2) may be formed on substrate 12. Interlayer 14 may be an organic interlayer such as UV absorbing polymer layer which includes phenyl groups, examples being polystyrene-maleic anhydride, polyimides, polysulfones, parylenes, and SU-8 (epoxy). An example of an interlayer coating solution is a polystyrene-maleic anhydride polymer of molecular weight 202 gm/mole dissolved in acetone solution to make up a 2% solution by weight. Interlayer 14 may be formed on substrate 12 by spin coating and baking. Other methods of deposition of the interlayer include spraying, vapor phase deposition, printing, dip coating or stamping. The spin coating may be conducted in two steps: a first step conducted for at least three seconds and at a speed of at least 500 revolutions per minute; and, a second step conducted for at least twenty seconds and at a speed of at least 2500 revolutions per minute. The baking step may be conducted on a hotplate for at least five minutes at a temperature of at least sixty degrees Celsius to dry the interlayer. Interlayer 14 may have a thickness 16 of approximately 10 nanometers or greater and may be coated over an entirety of an upwardly facing surface 18 of substrate 12.

An indium tin oxide (ITO) layer 20 may be formed on interlayer 14 (as shown in FIG. 2), or may be formed directly on substrate 12 (as shown in FIG. 1), by coating a precursor solution and then sintering the entire composite. In one example embodiment, ITO layer 20 of indium tin oxide solution is spin coated on interlayer 14 to a thickness 21 of approximately one thousand Angstroms or more. A typical ITO precursor solution has the following composition: $SnCl_2$—$2H_2O$, gluconic acid, hydrochloric acid, $InCl_3$ and $H_2O$, in the ratio of 0.0559:2.94:0.064:0.504:2.497. The gluconic acid and the hydrochloric acid are used for stabilizing the ITO precursor in the solution. The spin coating of the ITO layer 20 may be conducted in two steps: a first step of spin coating the ITO precursor solution for at least three seconds at a speed of at least 500 revolutions per minute; followed by a second step in which the substrate is spun at 2500 revolutions per minute for 20 seconds.

Referring to FIGS. 1-3, ITO layer 20 may then be sintered by a sintering device 22 which might be a localized heating device such as a laser or a hot air gun or ambient such as an oven, and/or laser ablated by a laser device 24 to form one or more features 26 therein. The ITO precursor layer 20 may also be sintered at approximately six hundred degrees Celsius so that it may exhibit conductive properties. Features 26 may be recessed within an upper surface 28 of ITO layer 20. In other embodiments, feature 26 may be a via, a resistor, or a raised surface such as a bump or mesa, for example.

FIG. 4 shows a diffuse energy device 24' that may be used together with a shadow mask 38 to define a feature 26. Use of a shadow mask 38 may allow simultaneous or parallel patterning of multiple features 26, e.g. channels, by including multiple openings within shadow mask 38 and use of a diffuse energy device 24'. Such parallel patterning may be utilized when the energy intensity used to create the pattern of multiple features 26 is low enough so that a diffuse energy source 24' is sufficient to define the features 26.

As shown in FIG. 1, ITO layer 20 may be formed directly on substrate 12 without use of an interlayer 14 (FIG. 2) there between. The process steps of forming, ablating and sintering layer 20 in an embodiment without an interlayer 14 may be the same as such steps conducted on layer 20 when layer 20 is positioned on an interlayer 14.

Creating uniform features 26, such as a uniform width channel 30 (FIG. 4) which may be patterned so as to electrically separate the source and the drain in a transistor or form a conductive channel for the formation of a gate electrode in a field effect transistor, may be important in reducing variability in transistor performance especially in large active matrix displays of transistors formed in layer 20. Accordingly, forming uniform features may be important in manufacturing printed display devices. Laser patterning of the channel 30 may be an effective method to create narrow and uniform channels. Patterning of the ITO layer is accomplished by removing the ITO layer in the regions where a conductive surface is not utilized. Laser ablation after such sintering may utilize a very slow pass of the laser device, or many passes of the laser device, to form a non-conductive channel and, therefore, may be a difficult and inefficient process. In other words, laser ablating a feature within an ITO layer after sintering of the ITO layer may be difficult to accomplish with few quick passes of a laser device.

In one example embodiment of a method of the present invention, ITO layer 20, as shown in FIGS. 1 and 2, is laser ablated prior to sintering, as shown in FIG. 4, which may simplify and improve the efficiency of the laser ablation process. In this example, ITO layer 20 is spin coated on interlayer 14 and then baked at sixty degrees Celsius for thirty minutes. ITO layer 20 is then laser ablated by laser device 24 at an energy level of at least 650 mJ/cm$^2$, and, more particularly, at 700 mJ/cm$^2$, for example, to form a feature 26 such as a source/drain channel 30. After feature 26 is formed, ITO layer 20 is then sintered with sintering device 22 at a temperature of six hundred degrees Celsius for sixty minutes, for example. Sintering device 22 may be a concentrated heat source, a more diffuse sintering device such as an oven, or any other type of sintering device as may be applicable for a particular application. In the embodiment shown, a conductivity between first and second features 32 and 34, such as a first electrode pad 32 and a second electrode pad 34, positioned on opposite sides of laser ablated channel 30, was measured to be zero, which indicated complete ablation of the ITO in channel region 30. In another embodiment, this process may result in a microelectronic device 10 wherein a feature formed within channel 30 may provide a resistance between a source 32 and a drain 34 of 0.1 to 0.01 Mega ohms, or an amperage at five volts direct current (DC) of $1\times10^{-8}$ amps, for example.

Ablating ITO layer 20 prior to sintering the layer 20, with a focused laser device 24 or with a diffuse energy device 24', may allow formation of features 26 with a single, relatively quick and efficient pass of laser device 24, or with fewer laser passes of laser device 24, such as 10 to 50 passes, when compared to prior art formation processes, which may utilize hundreds to thousands of laser passes. Accordingly, ablating ITO layer 20 prior to sintering may improve the efficiency and cost of the process of forming a microelectronic device 10.

Moreover, ablating an ITO layer 20 prior to sintering may allow formation of features 26 having a length 36 of 20 microns or less, which heretofore was difficult to accomplish with inkjet feature defining processes of the prior art. Accordingly, ablation of an ITO layer 20 prior to sintering may allow formation of features 26 having a small size, and therefore may allow formation of a microelectronic device 10 that may operate in a more efficient, more speedy, and more cost effective manner than prior art devices.

Additionally, ablating an ITO layer 20 prior to sintering may allow parallel processing of an ITO layer 20 with a photomask or a shadow mask 38 because of the lower fluence utilized to ablate the ITO.

Figure 6:
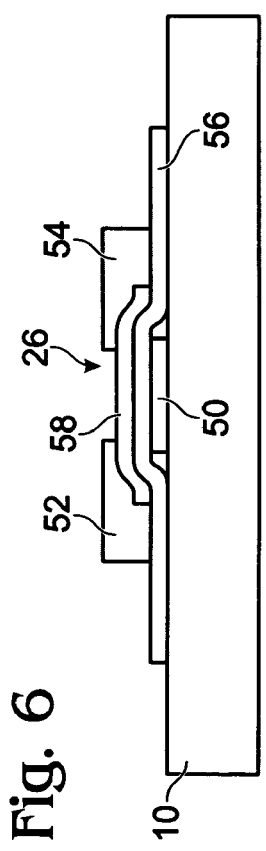
FIG. 6 is a schematic side cross-sectional view of one example embodiment of a microelectronic device where a conductive channel is utilized as a gate electrode.

FIGS. 5A and 5B are schematic top views of one embodiment of a non-conductive region and one embodiment of a conductive region, respectively. In particular, FIG. 5 shows one embodiment wherein feature 26 which has been ablated is a rectangular region 40 that, after ablation, will define a non-conductive region 42 surrounded by a non-ablated, conductive region 44. In contrast, FIG. 6 shows one embodiment wherein feature or ablated region 26 includes the region around a rectangular, non-ablated region 46, such that ablated region 26 defines a non-conductive region 48. Accordingly, feature 26 may define a conductive or a non-conductive region, depending on the characteristics of the region(s) ablated and the characteristics of the adjacent, non-ablated region(s).

FIG. 6 is a schematic side cross-sectional view of one example embodiment of a microelectronic device 10 wherein ablated feature 26 is a conductive channel utilized as a gate electrode 50 positioned between a drain 52 and a source 54 and adjacent a dielectric 56 and a semiconductor layer 58.

Figure 7:
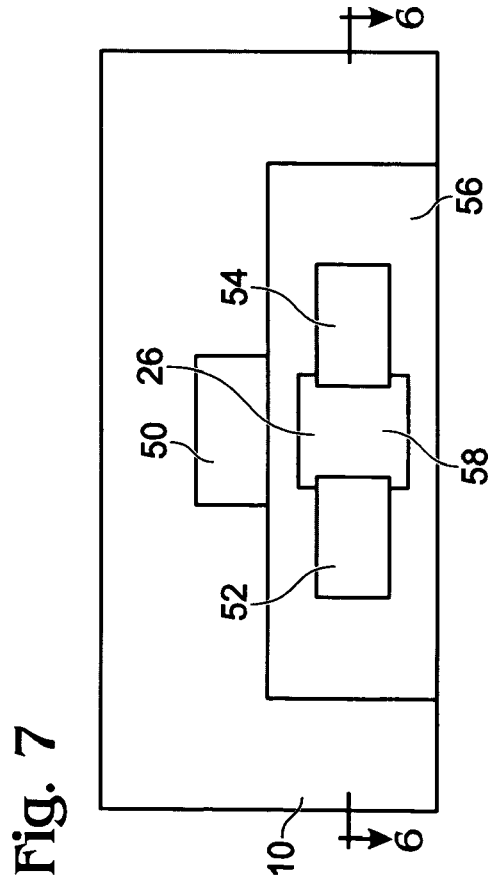
FIG. 7 is a schematic top view of the device of FIG. 6.

FIG. 7 is a schematic top view of the device of FIG. 6.

FIG. 8 is a schematic top view of several example embodiments of ITO patterns that may be formed on a microelectronic device 10 manufactured in accordance with one example embodiment of a method of manufacturing a microelectronic device.

Other variations and modifications of the concepts described herein may be utilized and fall within the scope of the claims below.

We claim:

1. A method of manufacturing a micro electronic device, comprising:
   providing a non-polymeric substrate;
   forming an organic interlayer on said non-polymeric substrate; and
   forming an indium tin oxide layer directly on said organic interlayer, wherein said indium tin oxide layer is formed by an indium tin oxide solution that is laser ablated prior to sintering.

2. The method of claim 1 further comprising ablating a feature into said indium tin oxide layer.

3. The method of claim 2 further comprising, sintering said device after ablating said feature into said indium tin oxide layer.

4. The method of claim 1 wherein said organic interlayer is formed on said substrate by spin coating and baking.

5. The method of claim 4 wherein said spin coating is conducted in two steps, a first step conducted for at least three seconds and at a speed of at least 500 revolutions per minute, and a second step conducted for at least twenty seconds and at a speed of at least 2500 revolutions per minute.

6. The method of claim 4 wherein said baking is conducted on a hotplate for at least five minutes at a temperature of at least sixty degrees Celsius.

7. The method of claim 4 wherein said organic interlayer is further formed by a second baking step in an oven for at least fifty minutes at a temperature of at least 550 degrees Celsius.

8. The method of claim 2 wherein said ablation is conducted at an energy of at least 650 mJ/cm$^2$.

9. The method of claim 1 wherein said indium tin oxide layer is formed of an indium tin oxide solution.

10. A method of forming a microelectronic device, comprising:
    providing a non-polymeric substrate;
    forming an indium tin oxide layer on said substrate;
    ablating a feature into said indium tin oxide layer; and
    wherein said indium tin oxide layer is formed by an indium tin oxide solution that is laser ablated prior to sintering.

11. The method of claim 10 further comprising forming an organic interlayer on said substrate prior to forming said indium tin oxide layer thereon.

12. The method of claim 10 wherein said ablating is chosen from one of focused ablation and diffuse ablation utilizing a shadow mask.

* * * * *

UNITED STATES PATENT AND TRADEMARK OFFICE
CERTIFICATE OF CORRECTION

| | | |
|---|---|---|
| PATENT NO. | : 7,923,837 B2 | Page 1 of 1 |
| APPLICATION NO. | : 11/981011 | |
| DATED | : April 12, 2011 | |
| INVENTOR(S) | : Betrabet et al. | |

It is certified that error appears in the above-identified patent and that said Letters Patent is hereby corrected as shown below:

On the Title page, in Item (57), Abstract, in column 2, lines 7-10, below "sintering." delete "Applicant respectfully submits that the above amendments bring the Abstract into compliance with MPEP §608.01 (b). Accordingly, Applicant respectfully requests reconsideration and withdrawal of the objection to the abstract."

Signed and Sealed this
Ninth Day of August, 2011

David J. Kappos
*Director of the United States Patent and Trademark Office*